United States Patent [19]

Blonder et al.

[11] Patent Number: 5,382,300

[45] Date of Patent: Jan. 17, 1995

[54] SOLDER PASTE MIXTURE

[75] Inventors: Greg E. Blonder, Summit; Yinon Degani, Highland Park; Thomas D. Dudderar, Chatham, all of N.J.

[73] Assignee: AT&T Corp., Murray Hill, N.J.

[21] Appl. No.: 216,225

[22] Filed: Mar. 22, 1994

[51] Int. Cl.$^6$ .............................................. B23K 35/34
[52] U.S. Cl. ..................... 148/24; 420/558; 420/559; 420/570
[58] Field of Search .................. 148/24, 23; 420/558, 420/570

[56] References Cited

U.S. PATENT DOCUMENTS

| | | | |
|---|---|---|---|
| 4,767,471 | 8/1988 | McLellan | 148/24 |
| 4,865,654 | 9/1989 | McLellan | 148/24 |
| 4,921,550 | 7/1989 | McLellan | 148/24 |
| 5,211,764 | 5/1993 | Degani | 148/25 |
| 5,229,070 | 7/1993 | Melton | 420/559 |

OTHER PUBLICATIONS

H. H. Manko, "Soldering Handbook for Printed Circuits and Surface Mounting," Van Nostrand Reinhold (New York) 1986, pp. 290–294.

J. S. Hwang, Ph.D, "Solder Paste in Electronics Packaging," Van Nostrand Reinhold, Chapter 4, p. 73.

*Primary Examiner*—Peter D. Rosenberg
*Attorney, Agent, or Firm*—Oleg E. Alber

[57] ABSTRACT

A solder paste is composed of a vehicle (or flux) system and a mixture of at least two solder powders. One component of this mixture is a eutectic or near-eutectic Sn/Pb alloy powder, while the other component comprises powders selected from at least one elemental metal powder or at least one solder alloy powder or at least one elemental metal powder and at least one solder alloy powder. Said other component is a powder or combination of powders each of which has a liquidus temperature which is lower by at least 5 degrees Centigrade (°C.) than the solidus temperature of said eutectic or near-eutectic Sn/Pb alloy powder or a solidus temperature which is higher by at least 5° C. than the liquidus temperature of said eutectic or near-eutectic Sn/Pb alloy powder. The eutectic or near-eutectic Sn/Pb powder makes up from 5 to 95 weight percent of the total powder mixture. Alternatively, not all powders which comprise the second component need to obey this rule so long as at least 30% by wt. of the entire powder mixture has a solidus temperature which is at least 5° C. higher than the highest liquidus temperature of the eutectic or near-eutectic Sn/Pb alloy powder. This solder paste results in an uncompromised consolidation and wetting process in which all of the solder joints or balls are formed on and wetted to an appropriate contact by the solder reflow process.

20 Claims, No Drawings

SOLDER PASTE MIXTURE

FIELD OF THE INVENTION

This invention concerns an improved solder paste.

BACKGROUND OF THE INVENTION

Solder paste is widely used in the electronic industry. For example, solder paste reflow is used for surface mount assembly of packaged electronic components onto circuit boards, and to form solder balls (bumps) on ball grid array (BGA) electronic packages. For surface mounting applications which use solder paste/reflow technology, interconnections to an electronic component such as a packaged IC unit (integrated circuit chip or multi-chip module) or a discrete component (a resistor, a capacitor, a transistor or a diode) take the form of leaded or unleaded arrays of solderable I/O (input-output) connections. Examples include surface mountable IC packages with perimeter arrays of solder wettable butt, J or gull-wing shaped metal leads, surface mountable discrete components with solder wettable contact pads and surface mountable BGA packages with area or grid arrays of solder wettable OF pads, each with its own solder ball. The "surface mount" assembly process involves placing individual deposits of solder paste over each of the solder wettable contact pads of the main circuit board and aligning the array of I/O contacts (IC leads, discrete component contact pads or BGA solder balls) on the component to the pattern of solder paste deposits that was placed on the contact pads of the main circuit board. The solder wettable I/O contacts of the surface mountable package unit are then placed into the solder paste deposits. The process of alignment and placement is repeated until the main circuit board is fully populated. This assembly is then heated so as to melt the solder in the paste such that, upon subsequent cooling and solidification, the solder forms joints. As a result of forming these solder joints, all of the I/O contacts on every component are bonded electrically and mechanically to the appropriate contact pads on the main circuit board. This process is know as a solder paste "reflow" assembly.

Another application of solder paste is to form solder balls on an area array of solder wettable metal pads that comprise the I/O contacts on a surface mountable ball grid array (BGA) package. Such an application is described by Y. Degani, T. D. Dudderar and W. L. Woods, Jr. in U.S. application Ser. No. 08/128492 filed Sep. 23, 1993. This patent application discloses an expedient process for producing solder balls (or bumps) on a grid array of solder wettable metal I/O pads. In this process solder paste is stencil printed onto the solder wettable metal I/O pads on the bottom side of the BGA and then reflowed to form solder balls (or bumps) on each pad. This process is known as printed solder "bumping", and the resulting solder bumps or balls comprise the I/O contacts for applications such as surface mount reflow assembly of the BGA packages onto printed circuit boards as described above.

In both of these applications the solder paste is comprised of a flux system plus a solder alloy in powder form. In order to assure that the resulting solder joints be consistently uniform and reliable, it is important that the paste be designed so that most of the solder powder will consolidate into a single mass during the reflow process. Here "most of the solder" means at least 97%, preferably 99%, most preferably 99.5% (by weight) of the total solder powder. Furthermore, for surface mount assembly it is also necessary that this single, well consolidated mass of reflowed solder be formed on and wetted to the solder wettable metal pad on which the paste was initially printed and robustly wetted to the packaged IC lead, discrete component contact pad or BGA solder ball. Solder pastes which incorporate solder powders of eutectic or near-eutectic alloys, such as 63/37 Sn/Pb or 60/40 Sn/Pb, respectively, will occasionally fail to meet these criteria. For example, (1) in the surface mount assembly of components to a circuit board, occasionally a stray non-consolidated (eutectic or near-eutectic alloy) solder ball will be found under the component after reflow, or (2) in bumping a BGA with a eutectic or near eutectic alloy solder paste as described above, occasionally a well-consolidated solder ball will be found in a location well off of the solder wettable metal I/O pad after reflow. Since such a misplaced solder ball is not in contact with the circuitry, the entire BGA package is rendered unusable. On the other hand, in the case of example (1), the stray solder ball is a potential reliability risk in terms of either an insufficient solder joint volume or an electrical short. (See H. H. Manko, *Soldering Handbook for Printed Circuits and Surface Mounting*, pages 290 to 294, Van Nestrand Reinhold (New York ) 1986.

Clearly, a need exists for solder paste compositions which, when applied to surface mount assembly or BGA solder ball formation, result in an uncompromised consolidation and wetting process in which all of the solder joints or balls are uniform, and every uniform solder joint or ball is formed on and wetted to an appropriate contact by the solder reflow process.

SUMMARY OF THE INVENTION

A solder paste embodying this invention is composed of a vehicle (or flux) system and a mixture of at least two solder powders. One component of this mixture is a eutectic or near-eutectic Sn/Pb alloy powder, while the other component comprises powders selected from at least one elemental metal powder or at least one solder alloy powder or at least one elemental metal powder and at least one solder alloy powder. Said other component is a powder or combination of powders each of which has a liquidus temperature which is lower by at least 5 degrees Centigrade (°C.) than the solidus temperature of said eutectic or near-eutectic Sn/Pb alloy powder or a solidus temperature which is higher by at least 5° C. than the liquidus temperature of said eutectic or near eutectic Sn/Pb alloy powder. The eutectic or near eutectic Sn/Pb powder makes up from 5 to 95 weight percent of the total powder mixture. Alternatively, not all powders which comprise the second component need to obey this rule so long as at least 30% by wt. of the entire powder mixture has a solidus temperature which is at least 5° C. higher than the highest liquidus temperature of the eutectic or near-eutectic Sn/Pb alloy powder.

DETAILED DESCRIPTION OF THE INVENTION

A solder paste embodying this invention is composed of a vehicle (or flux) system and a mixture of two or more solder powders. One component of the mixture is an Sn/Pb alloy powder having a eutectic or near-eutectic alloy composition such as 63/37 Sn/Pb alloy or 60/40 Sn/Pb alloy, respectively. The 63/37 or 60/40 means a ratio of Sn to Pb in wt.%,. The other component of the mixture is a powder or a combination of powders, each of which has a liquidus temperature which is lower by at least 5° C. than the solidus temperature of the eutectic or near-eutectic Sn/Pb alloy powder or a solidus temperature which is higher by at least 5° C. than the liquidus temperature of the eutectic or near eutectic alloy powder.

The solder paste includes a vehicle (or flux) and a solder powder mixture. The vehicle is present in the paste in an amount sufficient to allow proper dispensing or application of solder paste in methods such as screen or stencil printing, typically in a range of from 7 to 12 wt.% of the solder paste with the remainder of the solder paste being the solder powder. The vehicle can be selected from the vehicles described in the above-identified U.S. application Ser. No. 08/128492 or in U.S. Pat. No. 5,211,764 or from any other vehicle (or flux) that a person experienced in the art will find suitable. The vehicle described in the above U.S. application includes 1-10 wt.% of an organic acid, 1-5 wt.% of a rheological additive comprising a polymer having a molecular weight greater than 50,000, 60-98 wt.% of solvent system, and 0-25 wt.% of further additive whose residue maintains high surface insulation.

This invention will be described with reference to an Sn/Pb alloy having a 63/37 eutectic composition; however the use of near-eutectic alloys such as 60/40 Sn/Pb is also contemplated. The eutectic or near eutectic Sn/Pb powder is present in the solder mixture in an amount ranging from 5 wt.% to 95 wt.%, the remainder being the other component of the mixture. This other component is a powder comprised of at least one single elemental metal or at least one solder alloy or a combination of at least one single elemental metal powder and at least one solder alloy powder. Each powder in this other component is, preferably, selected so that either its liquidus temperature is lower by at least 5 degrees Centigrade (°C.) than the solidus temperature of the eutectic or near eutectic Sn/Pb alloy or its solidus temperature is higher by at least 5° C. than the liquidus temperature of the eutectic or near eutectic Sn/Pb alloy. In the case of the other component being comprised of two or more different powders, the liquidus or solidus temperature requirements of all of these powders should satisfy the above conditions. This means that either the liquidus temperatures of all such other powders should be lower than the solidus temperature of the eutectic or near eutectic Sn/Pb alloy powder or the solidus temperatures of all such other powders should be higher than the liquidus temperature of the eutectic or near eutectic Sn/Pb alloy powder. This insures that particles of the composition with the lower liquidus temperature melt before the rest of the solder powders begins to melt, so as to wet the surfaces of the contact pads of the wettable leads (if present) and of the remaining unmelted solder particles having the higher melting temperature. Alternatively, not all powders which comprise the second component need to obey this rule so long as at least 30% by wt. of the entire powder mixture has a solidus temperature which is at least 5° C. higher than the highest liquidus temperature of the eutectic or near-eutectic Sn/Pb alloy powder.

The eutectic or near eutectic Sn/Pb alloy powder in some mixtures plays the role of a low melting temperature alloy and in other mixtures the role of a high melting temperature alloy. This means that, when the solder paste is heated, the solder in the paste does not melt homogeneously during the heating process but the low melting alloy powders, those whose liquidus temperature is lower than the lowest solidus temperature of other powders, will start to liquefy well before the higher melting alloy powders start to liquefy. As a result, the metal pads and the unmelted solder powder are wetted by the lower melting solder before all the solder mass is in a liquid form. This consolidates the solder paste into a single mass. When all the solder finally melts it is already in contact with the metal pad thus allowing surface tension to pull the rest of the molten solder to the pad. In those instances where the eutectic or near eutectic Sn/Pb powder is used as the low melting component, this powder is present in a range of from 5 wt.% to 70 wt.% of all the solder powder. In those instances where the eutectic or near eutectic Sn/Pb powder is present as a high melting component, this powder is present in a range of from 30 wt.% to 95 wt.% of all the solder powder.

In a preferred exemplary embodiment, said one of the powders is the eutectic 63/37 Sn/Pb alloy powder with a melting point (both the liquidus and the solidus temperature) of about 183° C. The solder composition may be exemplified by the following examples.

EXAMPLE: 1

Experiments were conducted in a BGA bumping process on a sample of 1,000 solder pads with a solder paste containing a 63/37 Sn/Pb powder and another alloy powder. The paste composition was 8 wt.% vehicle and 20 wt.% of 43/43/14 Sn/Pb/Bi solder powder (with a solidus temperature of 143° C. and a liquidus temperature of 163° C.), and 72 wt.% 63/37 Sn/Pb solder powder (with a eutectic melting point of 183° C.) based on the total weight of solder paste. The printing process to make a BGA was used as described in the above-identified application Ser. No. 08/128492, namely on an array of 30 mils in diameter pads spaced with 100 mils center to center distance. The solder paste was stencil printed as paste deposits 70 mils in diameter and 21 mils in height. The solder paste was deliberately misprinted so that each printed paste deposit was only in partial, e.g., about 50%, contact with each solder wettable pad instead of being centered on it. Such a large misalignment of the printed solder paste deposits with the solder wettable pads was done to amplify the occurrence of the off-the-pad consolidated solder balls. The printed samples were reflowed under a certain temperature-time profile. With this paste composition all of the solder bails formed from the mixed alloy paste were on the pads.

EXAMPLE: 2 (comparative)

In this experiment arrays of paste deposits were stencil printed similarly to Example 1 but with solder paste containing only a single eutectic 63/37 Sn/Pb alloy powder. The paste deposit arrays were treated under the same temperature-time profile as in Example 1. The result was that as many as 30% of the solder balls formed from this paste were placed off the pads rendering the arrays unsuitable for further use.

EXAMPLE: 3

The effect of using mixed alloy powders was further evaluated by using a system of two eutectic solder alloy powders. One alloy was 63/37 Sn/Pb alloy with melting temperature of 183° C. The other alloy was 96.5/3.5 Sn/Ag alloy the melting temperature of which at 221 °

C. was higher than the melting temperature of the 63/37 Sn/Pb alloy. In this experiment a series of different weight percent ratios of these two solder alloy powders were mixed with a flux vehicle to form a solder paste. Each resulting paste with a different ratio of solder alloy powders was tested on a separate sample of 1000 solder pads. Each paste was printed on a board that had 10 arrays of 10 by 10 solder wettable pads each 30 mils in diameter and spaced 100 mils center-to-center distance. Each solder paste print was 70 mils in diameter and 21 mils in height and was misaligned from the wettable pad by about 50 percent. As in Example 1, such a large misalignment was done to amplify the occurrence of the off-the-pad consolidated balls. The boards were reflowed and then checked for defects, that is for solder balls that consolidated off the pad instead of on the pad. The results of this experiment were as follows:

| Sn/Ag %      | 100 | 98 | 95 | 80 | 50 | 30 | 15 | —   |
|--------------|-----|----|----|----|----|----|----|-----|
| Sn/Pb %      | —   | 2  | 5  | 20 | 50 | 70 | 85 | 100 |
| # of defects | 950 | 13 | 0  | 0  | 0  | 0  | 3  | 400 |

In Table 1 below is shown a number of further exemplary composition mixtures of the 63/37 Sn/Pb powder and of the other component. When more than one powder is present in the other component, an exemplary amount of the presence of each powder in the other component is shown in wt.% based on the total amount of powder in the composition.

TABLE 1

Examples of Alloy Mixtures that Suppress off the Pad Solder Balling

| One Component Weight % of 63/37 Sn/Pb alloy | Other Component |  |  |  |  |  |  |  |
|---|---|---|---|---|---|---|---|---|
|  | 2nd Alloy or Elemental Metal |  |  |  | 3rd Alloy |  |  |  |
|  | Composition | wt. % | Solidus °C. | Liquidus °C. | Comp. | wt. % | Solidus °C. | Liquidus °C. |
| 70 | 100 Sn | 18.3 | 232 | 232 | 5/95 Sn/Pb | 11.7 | 308 | 312 |
| 70 | 100 Sn | 17.7 | 232 | 232 | 10/90 Sn/Pb | 12.3 | 268 | 302 |
| 70 | 100 Sn | 30 | 232 | 232 | N/A | N/A | N/A | N/A |
| 70 | 96.5/3.5 Sn/Ag | 30 | 221 | 221 | " | " | " | " |
| 70 | 95/5 Sn/Sb | 30 | 235 | 240 | " | " | " | " |
| 70 | 86/9/5 Sn/Zn/In | 30 | 188 | 188 | " | " | " | " |
| 95 | 43/43/14 Sn/Pb/Bi | 5 | 144 | 163 | " | " | " | " |
| 95 | 42/58 Sn/Bi | 5 | 138 | 138 | " | " | " | " |
| 95 | 52/48 Sn/In | 5 | 118 | 131 | " | " | " | " |

Furthermore, the other component of the powder mixture may include x/(100-x) Sn/Pb alloy wherein x is the percentage of Sn based on the total weight of the x/(100-x) Sn/Pb alloy and $1 < X < 18$. This alloy may be used as a single alloy or it may be one of at least two solder powders of the other component, for example, as a combination of an elemental Sn and the x/(100-x) Sn/Pb alloy wherein x is the percentage of Sn in the x/(100-x) Sn/Pb alloy and $1 < X < 18$. A preferred combination of Sn and x/(100-x) Sn/Pb alloy would be such that after melting the components of the powder mixture, the molten liquid will form an alloy with a eutectic or near-eutectic composition.

The above examples have been described using a 63/37 Sn/Pb eutectic alloy powder, with a melting point (both liquidus and solidus) of 183° C., as the first component. However other alloys, such as a near-eutectic 60/40 Sn/Pb alloy powder, may be used as the first component so long as the liquidus and solidus temperature requirements of the other component, described above with reference to the eutectic 63/37 Sn/Pb alloy, are satisfied. This means, for example, that for the near-eutectic 60/40 Sn/Pb alloy powder the liquidus temperature of the other component of the solder powder mixture should be at least 5° C. lower than the solidus temperature (183° C.) of the 60/40 Sn/Pb alloy powder or the solidus temperature of the other component should be at least 5° C. higher than the liquidus temperature (190° C.) of the 60/40 Sn/Pb alloy powder. Of course the selection will depend on whether the 60/40 Sn/Pb alloy powder is being used as a lower or a higher melting component, respectively.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A solder paste comprising a vehicle and a mixture of at least two solder powders, one component of said mixture being a eutectic or near eutectic Sn/Pb alloy powder and another component of said mixture is selected from at least one elemental metal, at least one solder alloy and a mixture of at least one elemental metal and at least one alloy, wherein powders of said other component are selected from powders
   1) each of which has a liquidus temperature which is lower by at least 5° C. than a solidus temperature of said eutectic or near-eutectic Sn/Pb powder,
   2) each of which has a solidus temperature which is higher by at least 5° C. than a liquidus temperature of said eutectic or near-eutectic Sn/Pb powder, and
   3) at least one of which has a solidus temperature which is higher by at least 5° C. than a liquidus temperature of said eutectic or near-eutectic Sn/Pb powder, said at least one of the powders with said higher solidus temperature making up at least 30 wt. % of the powders in the total powder mixture, and
   said eutectic or near eutectic Sn/Pb alloy comprising between 5 and 95 weight percent of the powder mixture.

2. A solder paste of claim 1, in which said eutectic or near eutectic Sn/Pb alloy is selected from the group consisting of a 63/37 Sn/Pb alloy and a 60/40 Sn/Pb alloy.

3. A solder paste of claim 1, in which said one component is a eutectic or near eutectic Sn/Pb alloy present as a component of the powder mixture having a higher solidus temperature than the highest liquidus temperature of said other component Of the powder mixture.

4. A solder paste of claim 3, in which said other component is selected from the group consisting of 43/43/14 Sn/Pb/Bi, 42/58 Sn/Bi, and 52/48 Sn/In.

5. A solder paste of claim 3, in which said eutectic or near eutectic Sn/Pb alloy powder comprises 30–95 wt.% of the powder mixture.

6. A solder paste of claim 1, in which said one component is a eutectic or near eutectic Sn/Pb alloy powder present as a component of the powder mixture having a lower liquidus temperature than the lowest solidus temperature of at least one of the powders of said other component of the powder mixture, said eutectic or near eutectic Sn/Pb powder comprises from 5 to 70 wt.% of the powder mixture.

7. A solder paste of claim 6, in which said other component comprises at least one powder selected from the group consisting of elemental Sn, 96.5/3.5 Sn/Ag, 95/5 Sn/Sb, 86/9/5 Sn/Zn/In, and a Sn/Pb alloy whose composition satisfies the relationship x/(100-x) wherein x is the percentage of Sn based on the total weight of said Sn/Pb alloy and $1 < X < 18$.

8. A solder paste of claim 6, in which said other component comprises a elemental Sn and a Sn/Pb alloy with the composition x/(100-x) wherein x is the percentage of Sn based on the total weight of the x/(100-x) Sn/Pb alloy and $1 < X < 18$, and the Sn powder and the x/(100-x) Sn/Pb alloy powder are proportioned such that after melting the two components of the mixture the molten liquid will form an alloy with a eutectic or near eutectic Sn/Pb composition.

9. A solder paste of claim 6, in which said other component comprises 61 wt.% of Sn and 39 wt.% of 5/95 Sn/Pb based on a total amount of Sn and 5/95 Sn/Pb powders.

10. A solder paste of claim 6, in which said other component comprises 59 wt.% Sn and 41 wt.% of 10/90 Sn/Pb based on a total amount of Sn and 10/90 Sn/Pb powders.

11. A process for forming a solder paste mixture, comprising the steps of
providing a vehicle for solder paste,
providing a plurality of particles of one component of the solder mixture, said one component being a eutectic or near-eutectic Sn/Pb alloy,
providing a plurality of particles of another component of the solder mixture, said other component being selected from at least one elemental metal, at least one solder alloy and a mixture of at least one elemental metal and at least one solder alloy, wherein powders of said other component are selected from powders
1) each of which has a liquidus temperature which is lower by at least 5 °C. than the solidus temperature of said eutectic or near-eutectic Sn/Pb powder,
2) each of which has a solidus temperature which is higher by at least 5° C. than a liquidus temperature of said eutectic or near-eutectic Sn/Pb powder, and
3) at least one of which has a solidus temperature which is higher by at least 5° C. than a liquidus temperature of said eutectic or near-eutectic Sn/Pb powder, said at least one of the powders with said higher solidus temperature making up at least 30 wt. % of the powders in the total powder mixture, and
mixing said vehicle, said one component and said other component to form a paste mixture in which said eutectic or near-eutectic Sn/Pb alloy comprises from 5 to 95 weight percent of the metallic content of the paste mixture.

12. A process of claim 11, in which said eutectic or near-eutectic Sn/Pb alloy is selected from the group consisting of a 63/37 Sn/Pb alloy and a 60/40 Sn/Pb alloy.

13. A process of claim 11, in which said one component is a eutectic or near eutectic Sn/Pb alloy present as a component of the powder mixture having a solidus temperature higher than the highest liquidus temperature of said other component of the powder mixture.

14. A process of claim 13, in which said other component is selected from the the group consisting of 43/43/14 Sn/Pb/Bi, 42/58 Sn/Bi, and 52/48 Sn/In.

15. A process of claim 13, in which said eutectic or near eutectic Sn/Pb alloy powder comprises from 30–95 wt.% of the powder mixture.

16. A process of claim 11, in which said one component is a eutectic or near eutectic Sn/Pb alloy present as a component of the powder mixture having a lower liquidus temperature than the lowest solidus temperature of at least one of the powders of said other component of the powder mixture, said eutectic or near-eutectic Sn/Pb alloy powder comprises from 5 to 70 wt.%. of the mixture.

17. A process of claim 16, in which said other component of the powder mixture comprises at least one powder selected from the group consisting of elemental Sn, 96.5/3.5 Sn/Ag, 95/5 Sn/Sb, 86/9/5 Sn/Zn/In and a Sn/Pb alloy whose composition satisfies the relationship x/(100-x) wherein x is the percentage of Sn based on the a total weight of said x/(100-x) Sn/Pb alloy and $1 < X < 18$.

18. A process of claim 16, in which said other component comprises an elemental Sn and a Sn/Pb alloy with the composition x/(100-x) wherein x is the percentage of Sn based on the total weight of said Sn/Pb alloy and $1 < X < 18$, and the Sn powder and the x/(100-x) Sn/Pb alloy powder are proportioned such that after melting the two components of the mixture, the molten liquid will form an alloy with a eutectic or near eutectic Sn/Pb composition.

19. A process of claim 16, in which said other component comprises 59 wt.% Sn and 39 wt.% of 5/95 Sn/Pb based on a total amount of Sn and 5/95 Sn/Pb powders.

20. A process of claim 16, in which said other component comprises 59 wt.% Sn and 41 wt.% 10/90 Sn/Pb based on a total amount of Sn and 10/90 Sn/Pb powders.

* * * * *